(12) United States Patent
Hu et al.

(10) Patent No.: US 10,867,959 B2
(45) Date of Patent: Dec. 15, 2020

(54) INTEGRATED CIRCUIT PACKAGING METHOD AND INTEGRATED PACKAGED CIRCUIT

(71) Applicant: Shenzhen Xiuyuan Electronic Technology Co., Ltd., Guangdong (CN)

(72) Inventors: Chuan Hu, Chandler, AZ (US); Junjun Liu, Albany, NY (US); Yuejin Guo, Phoenix, AZ (US); Edward Rudolph Prack, Phoenix, AZ (US)

(73) Assignee: Shenzhen Xiuyuan Electronic Technology Co., Ltd, Guangdong (CN)

( * ) Notice: Subject to any disclaimer, the term of this patent is extended or adjusted under 35 U.S.C. 154(b) by 0 days.

(21) Appl. No.: 16/464,880

(22) PCT Filed: Nov. 30, 2016

(86) PCT No.: PCT/CN2016/107833
§ 371 (c)(1),
(2) Date: May 29, 2019

(87) PCT Pub. No.: WO2018/098649
PCT Pub. Date: Jun. 7, 2018

(65) Prior Publication Data
US 2019/0326207 A1    Oct. 24, 2019

(51) Int. Cl.
| | | |
|---|---|---|
| H01L 23/00 | (2006.01) |
| H01L 21/48 | (2006.01) |
| H01L 23/498 | (2006.01) |
| H01L 23/12 | (2006.01) |
| H05K 1/00 | (2006.01) |

(Continued)

(52) U.S. Cl.
CPC ............ *H01L 24/83* (2013.01); *H01L 21/486* (2013.01); *H01L 21/4853* (2013.01);
(Continued)

(58) Field of Classification Search
None
See application file for complete search history.

(56) References Cited

U.S. PATENT DOCUMENTS

| | | | |
|---|---|---|---|
| 5,171,712 A | 12/1992 | Wang et al. | |
| 5,407,864 A * | 4/1995 | Kim ............ | H01L 21/486 |
| | | | 29/834 |

(Continued)

FOREIGN PATENT DOCUMENTS

| | | |
|---|---|---|
| CN | 1348204 A | 5/2002 |
| CN | 101199242 A | 6/2008 |
| CN | 104756247 A | 7/2015 |

OTHER PUBLICATIONS

Jul. 27, 2017—(CN) International Search Report—App PCT/CN2016/107833—Eng Tran.

(Continued)

*Primary Examiner* — J. E. Schoenholtz
(74) *Attorney, Agent, or Firm* — Banner & Witcoff, Ltd.

(57) ABSTRACT

An integrated circuit packaging method, including: a top surface of a substrate, a bottom surface of the substrate, or the interior of the substrate is provided with circuit layers, and the circuit layers are provided with circuit pins; a component element is mounted on the substrate, and a surface of the component element facing the substrate is provided with component pins; connection through holes are formed on the substrate, the connection through holes are made to abut on the circuit pins, and a first opening of the connection through holes is abutted on the component pins; conductive layers are fabricated inside of the connection through holes by means of a second opening of the connec- (Continued)

tion through holes, and the conductive layers electrically connect the component pins with the circuit pins.

15 Claims, 7 Drawing Sheets

(51) Int. Cl.
  *H01L 21/56* (2006.01)
  *H01L 23/31* (2006.01)
  *H01L 23/538* (2006.01)
  *H01L 25/065* (2006.01)

(52) U.S. Cl.
  CPC ...... *H01L 21/4864* (2013.01); *H01L 21/4867* (2013.01); *H01L 21/56* (2013.01); *H01L 23/12* (2013.01); *H01L 23/3128* (2013.01); *H01L 23/4985* (2013.01); *H01L 23/49816* (2013.01); *H01L 23/49827* (2013.01); *H01L 23/49833* (2013.01); *H01L 23/49838* (2013.01); *H01L 23/5384* (2013.01); *H01L 23/5385* (2013.01); *H01L 23/5386* (2013.01); *H01L 23/5387* (2013.01); *H01L 24/32* (2013.01); *H01L 25/0655* (2013.01); *H05K 1/00* (2013.01); *H01L 24/08* (2013.01); *H01L 2224/08235* (2013.01); *H01L 2224/3223* (2013.01); *H01L 2224/32235* (2013.01); *H01L 2224/838* (2013.01); *H01L 2224/83013* (2013.01); *H01L 2224/83031* (2013.01); *H01L 2224/83039* (2013.01); *H01L 2224/8385* (2013.01)

(56) References Cited

U.S. PATENT DOCUMENTS

| | | | | |
|---|---|---|---|---|
| 5,870,289 | A * | 2/1999 | Tokuda | H01L 21/6835 361/779 |
| 6,051,093 | A * | 4/2000 | Tsukahara | H01L 21/563 156/251 |
| 7,190,080 | B1 * | 3/2007 | Leu | H01L 21/568 257/690 |
| 7,532,479 | B2 * | 5/2009 | Ohno | G02B 6/0073 257/706 |
| 7,843,042 | B2 * | 11/2010 | Kuan | H01L 21/568 257/660 |
| 7,898,811 | B2 * | 3/2011 | Storey | F21K 9/00 361/719 |
| 9,480,162 | B2 | 10/2016 | Hossain et al. | |
| 10,615,151 | B2 * | 4/2020 | Hu | H01L 23/3107 |
| 2008/0196930 | A1 * | 8/2008 | Tuominen | H01L 23/5389 174/260 |
| 2010/0172116 | A1 * | 7/2010 | Yorita | H01L 21/565 361/816 |
| 2015/0179616 | A1 * | 6/2015 | Lin | H01L 25/50 257/773 |
| 2016/0066422 | A1 * | 3/2016 | Sakamoto | H05K 1/181 361/720 |
| 2016/0205765 | A1 * | 7/2016 | Takagi | H05K 1/0215 174/254 |

OTHER PUBLICATIONS

Jul. 27, 2017—(CN) Written Opinion of the International Search Authority—App PCT/CN2016/107833.

* cited by examiner

INTEGRATED CIRCUIT PACKAGING METHOD AND INTEGRATED PACKAGED CIRCUIT

CROSS-REFERENCE TO RELATED APPLICATION

The present application is a U.S. National Phase Application under 35 U.S.C. § 371 and claims priority to International Application No. PCT/CN2016/107833 filed Nov. 30, 2016, the content of which is hereby incorporated by reference in its entirety.

TECHNICAL FIELD

The disclosure belongs to the field of electronics, and in particular relates to an integrated circuit packaging method and an integrated packaged circuit.

BACKGROUND ART

In a conventional integrated circuit system, chips are separately packaged and then mounted on a circuit board together with other electronic devices (components). Data communication between chips and circuit connections between the chips and other electronic devices should be achieved by means of chip pins, electronics device pins and circuitry inside the circuit board. It is indispensable to reserve sufficient space between the chips as well as between other electronic devices and the chips, therefore the geometric dimension of the entire system is constrained and cannot be sufficiently miniaturized. Since it is required that each chip after being separately packaged is usually required to be connected to a circuit port of a substrate by bonding or flip-chip, and then connected to the circuit board. The materials are used in a large amount, the process is complicated, and the production cost is high. Moreover, various thermomechanical stress problems at the interface of each material are prone to be induced due to the use of a large number of materials having different characteristics.

SUMMARY

Based on this, the present disclosure overcomes the defects in the prior art, and provides an integrated circuit packaging method and an integrated packaged circuit, which has a simple manufacturing process, low cost, and ensures the reliability of the integrated packaged circuit.

Its technical solutions are as follows:

An integrated circuit packaging method comprising: providing a circuit layer on a top surface of a substrate, or a bottom surface of the substrate, or in a substrate, with the circuit layer having circuit pins; mounting a device on the substrate with the device having device pins (component pins) facing the substrate; forming connection through holes on the substrate; connecting the connection through holes with the circuit pins respectively, with a first opening of each connection through hole connected (interfaced) with the respective device pin; and forming a conductive layer in the connection through hole through a second opening of the connection through hole, with the conductive layer connecting the respective device pin with the respective circuit pin.

In one embodiment, a conductive bonding material is fed into the connection through hole by means of the second opening of the connection through hole during the process of forming the conductive layer in the connection through hole by means of the second opening of the connection through hole, such that the conductive layer is formed by bonding the conductive bonding material to the device pin and an inner wall of the connection through hole.

In one embodiment, the conductive bonding material is a solder ball, a solder paste, a conductive paste, or a conductive metal paste.

In one embodiment, the conductive bonding material is provided in the connection through hole by screen printing during the process of forming a conductive layer in the connection through hole by means of the second opening of the connection through hole.

In one embodiment, the conductive layer is formed by electroplating during the process of forming a conductive layer in the connection through hole by means of the second opening of the connection through hole.

In one embodiment, in the process of mounting the device on the substrate, an adhesive film is provided between the device and the substrate, with the adhesive film pasting the device to the substrate.

In one embodiment, during the process of forming a conductive layer in the connection through hole by means of the second opening of the connection through hole, laser melting, plasma cleaning, or a chemical solvent is configured to form additional through holes in the adhesive film by means of the second opening of the connection through hole, wherein the additional through holes connect the connection through holes with the device pins respectively, and the conductive layer extends into the additional through holes.

In one embodiment, a protective layer is provided on an inner wall of the connection through hole for protecting the substrate when the additional through holes are formed.

In one embodiment, the integrated circuit packaging method further includes: after the conductive layer is formed, providing an encapsulation layer on the substrate, wherein two said devices are encapsulated by the encapsulation layer and the substrate; or after the device is placed on the substrate and before forming the conductive layer, providing an encapsulation layer on the substrate, wherein the two devices are encapsulated by the encapsulation layer and the substrate.

In one embodiment, the devices are at least two.

In one embodiment, the integrated circuit packaging method further includes: providing an encapsulation layer on the substrate, wherein at least two of the devices are encapsulated by the encapsulation layer and the substrate.

In one embodiment, the device is a chip or an electronic device, and the at least two of the devices include at least one chip and at least one electronic device.

In one embodiment, before the forming the conductive layer, an auxiliary layer is formed on the inner wall of each connection through hole by means of the second opening, wherein the auxiliary layer is electrically connected to the circuit layer, and then the conductive layer is formed on the auxiliary layer.

In one embodiment, the conductive layer is formed by electroplating, and the auxiliary layer is formed by a sputtering or vapor (evaporation) deposition process before electroplating.

In one embodiment, before forming the connection through hole, a circuit base layer and a release layer (photoresist layer) are provided on the bottom surface of the substrate, wherein the circuit base layer is located between the release layer and the substrate, and after the auxiliary layer is formed, the circuit base layer is formed into the circuit layer by means of the release layer.

In one embodiment, after the conductive layer is formed, a conductive connection port electrically connected to the conductive layer is formed on the bottom surface of the substrate, wherein the conductive connection port is a solder ball dot matrix, a connection dot matrix, or a metal pin grid.

In one embodiment, the device is a chip, or an electronic device.

In one embodiment, the substrate is a flexible circuit board; or the substrate comprises at least two layers of flexible circuit boards arranged in a stacked manner.

An integrated circuit package structure comprising: a device, wherein the device is provided with device pins; a substrate, wherein a top surface of the substrate, a bottom surface of the substrate, or an interior of the substrate is provided with a circuit layer, the circuit layer is provided with circuit pins, the substrate is provided with connection through holes, and the circuit pins are connected to the connection through holes respectively; wherein the device is mounted on the substrate, the device pins face the substrate, a first opening of each connection through hole is connected to the respective device pin, a second opening of the connection through hole is an operation window, and a conductive layer is provided in the connection through hole, wherein the conductive layer electrically connects the respective device pin to the respective circuit pin.

In one embodiment, the device is mounted on the top surface of the substrate, wherein the top surface of the substrate is provided with the circuit layer, and an insulating medium is provided between the device and the substrate, the insulating medium is provided with additional through holes communicating with the first opening of each connection through hole, wherein each additional through hole is provided with an additional conductive layer, and the additional conductive layer together with the conductive layer electrically connect the respective device pin with the respective circuit pin.

In one embodiment, the substrate is a flexible circuit board, or the substantially comprises at least two layers of flexible circuit boards arranged in a stacked manner.

In one embodiment, the top surface of the substrate is provided with the circuit layer, and/or the bottom surface of the substrate is provided with the circuit layer, and/or the circuit layer is provided in the substrate, and the device pins are at least two, wherein one of the device pins is electrically connected to at least one of the circuit layers, and another one of the device pins is electrically connected to at least one of the remaining circuit layers.

The beneficial effects of the disclosure are:

1. The integrated circuit packaging method includes: providing the circuit layer on the top surface of the substrate, or on the bottom surface of the substrate, or in the substrate, with the circuit layer having circuit pins, wherein the circuit layer may be prepared in advance on the substrate, or the circuit layer may be formed on the substrate when packaging the integrated circuit, and the circuit pins may connection portions directly led out from the circuit layer, or may be extension pins electrically connected to the connection portions, as long as electrical connection with the circuit layer may be performed by means of the circuit pins. Mounting the device on the substrate, wherein the device may be fixed to the substrate or may not be fixed. The device and the substrate are oppositely arranged, and the device has device pins on a side facing the substrate, wherein the device pins of the device include, but are not limited to, connection portions led out from the device, extension pins electrically connected to the connection portions, as long as electrical connection with the device may be performed by means of the device pins. Forming connection through holes on the substrate, with the device pins connected to the first opening of each connection through hole, and forming the conductive layer in the connection through hole by means of the second opening of the connection through hole. The conductive layer electrically connects the respective device pin with the respective circuit pin; the device pins are located on the top surface of the substrate, and the device may be electrically connected to the circuit layer on the bottom surface of the substrate by means of the second opening of the through hole, so as to avoid the device from sheltering the device pins from above;

wherein the connection through holes are connected to the device pins, and each circuit pin is at least partially located near the first opening of the respective connection through hole or deep into the connection through hole, so that the conductive layer may be electrically connected to the device pin; the circuit pin is connected to the connection through hole, and the circuit pin is at least partially located near the first opening of the connection through hole, or near the second opening, or near the inner wall of the connection through hole, so that the conductive layer may be electrically connected to the circuit pin; the device may be a chip or an electronic device (including but not limited to resistor, capacitor) or other electronic devices (including but not limited to antennas). The device may be fixed to the substrate by the connection through holes or the conductive layers, or the device may be fixed to the substrate by other means (including but not limited to bonding, molding a plastic package).

In this way, the cost of the integrated circuit package can be reduced, and the packaging time can be saved. Further, a plurality of devices may be simultaneously mounted on a large substrate of a large area, and batch processing on the large substrate can further reduce the cost and save the packaging time. Moreover, this new system package can reduce the overall thickness of the system composed of the substrate and devices, and increase the integration density of the package, due to the fact that it is not necessary to reserve a gap between the substrate and the device (in principle, there is no need to reserve a gap, while other insulating materials may be placed between the substrate and devices as needed); data communication between the chips as well as between other devices and the chips can be implemented in the substrate without the need to bypass to a thicker circuit board, which can improve both bandwidth and speed of data communication; the single package of chips itself does not require steps of heating and soldering; more importantly, the much fewer types of materials are used in the entire system package, and process optimization is easier to be done to reduce the strength of thermo-mechanical stress in encapsulation and packaging of package layers, such as high-temperature processing engineering of encapsulation and packaging molded materials, which is of great significance for introduction of ultra-thin chips and incorporation of flexible circuit boards.

On the other hand, compared with bonding package (the electrical connection between the chips and the substrate circuit layer is realized by metal wires), the present disclosure realizes the electrical connection between the first chip and the circuit layer by forming the connection through holes on the substrate, the conductive layer is provided in each connection through hole and does not occupy extra space, which can greatly reduce the overall volume after packaging. In particular, the ability to reliably use a flexible circuit board as a substrate is a great advantage.

2. During the process of forming the conductive layer in the connection through hole by means of the second opening of the connection through hole, the conductive bonding material is fed from the second opening of the connection through hole into the connection through hole, so that the conductive bonding material is bonded to the device pin and the inner wall of the connection through hole to form the conductive layer. By feeding the conductive bonding material from the second opening, it is possible to operate on the bottom surface of the substrate without being obstructed by the devices, and the conductive bonding material is adhered to the inner wall of the connection through hole as well as the respective device pin of the device by bonding to realize both mechanical and electrical connections for obtaining a better conductive connection performance.

3. The conductive bonding material is solder ball, solder paste, conductive paste, or conductive metal paste, and one of or a combination of them may be selected according to the process requirements, the material of the substrate and the property of the inner wall of the connection through hole. The process of forming a conductive connecting channel by feeding the conductive bonding material may use a soldering process including surface cleaning, flux spraying, precise placement of solder balls and heat treatment using a ball machine, and chemical surface cleaning, surface treatment, precise spraying of solder paste, conductive paste or conductive metal paste may also be used, followed by heat treatment to form mechanical and electrical connections.

4. The conductive bonding material is provided in the connection through hole by screen printing during the process of forming the conductive layer in the connection through hole by means of the second opening of the connection through hole. Screen printing is a commonly used method for forming circuit layers. By using screen printing to form conductive layers, the same equipment may be utilized and screen printing may be synchronized with forming the circuit layer, saving process flow and further reducing costs.

5. The conductive layer is formed by electroplating during the process of forming the conductive layer in the connection through hole by means of the second opening of the connection through hole. Good electrical conductivity can be obtained, and the thickness of the conductive layer may be controlled by electroplating to obtain an ideal electrical conductivity.

6. In the process of mounting the device on the substrate, an adhesive film is provided between the device and the substrate, and the adhesive film bonds the device to the substrate. By using adhesion with the adhesive film, the device can be fixed to the substrate simply by placing the device on the substrate. The adhesive film may be made of an insulating material, so that even if a circuit layer is provided on the top surface of the substrate, the device pins can be electrically insulated from the circuit layer on the top surface of the substrate, and thus keeping electrical insulation between devices, and electrical connections are formed only where the conductive through holes are formed. The use of an insulating adhesive film to bond devices and substrates, in conjunction with the forming of the conductive through holes, provides a possibility to wire the circuit after placing the devices, thus data communication between the devices no longer requires additional devices in the circuit board, which improves the overall performance of the circuit board.

7. In the process of forming the conductive layer through the second opening of the connection through hole, laser melting, plasma cleaning, or chemical solvent is configured to form an additional through hole by means of the second opening of the connection through hole, wherein the additional through hole connects the connection through hole with the respective device pin, and the conductive layer extends into the additional through hole. By forming the additional through holes, the adhesive film may be prevented from hindering the electrical connections between the device pins, conductive layers, and circuit pins. Laser melting, plasma cleaning, or chemical solvent etching may be employed as needed.

8. A protective layer is provided on the inner wall of the connection through hole, and the protective layer is configured to protect the substrate when the additional through hole is formed. Processes including but not limited to chemical etching and drilling may be used for forming the additional through hole. In this case, it is necessary to pass through the connection through hole, which may damage the inner wall of the connection through hole, thereby causing damage to the substrate and the circuit layer. The protective layer can protects the inner wall of the connection through hole from damage. Further, the protective layer may be a material that facilitates electrical connection of the conductive layer, and in this case the protective layer may be in contact with the circuit pins to facilitate electrical connection between the circuit pins and the conductive layer. For example, the protective layer may be a thin metal film which is pre-sputtered or vapor-deposited on the inner wall of the connection through hole, so that the material of the inner wall of the connection through hole is protected from being exposed to the etching solvent or ions during the chemical etching process, and such a thin metal layer can also improve the electrical conductivity of the conductive layer that is subsequently plated in the connection through hole.

9. After the conductive layer is formed, an encapsulation layer is provided on the substrate, wherein the two of said devices are encapsulated and packaged by the encapsulation layer and the substrate; or, after the device is placed on the substrate and before the conductive layer shape is formed, an encapsulation layer is provided on the substrate, and the two devices are packaged by the encapsulation layer and the substrate. Encapsulation of the devices by the encapsulation layer protects the devices from environmental influences, and the encapsulation layer may cover the substrate, protect the substrate and the circuit layer on the substrate, and avoid bending and scratching. On the other hand, the devices may be fixed to the substrate by the encapsulation layer without additional procedures for fixing the devices.

10. The devices are at least two. The present integrated circuit packaging method is applicable to two or more devices. Further, operations may be performed on two or more devices at the same time, and the above devices are mounted on the substrate to realize electrical connection between the devices and the circuit layer, thereby improving the efficiency and saving costs.

11. The integrated circuit packaging method further includes providing an encapsulation layer on the substrate, at least two of said devices are encapsulated by the encapsulation layer and the substrate. The encapsulation layer mainly serves to protect the devices from external environmental factors such as the influence of water vapor and electromagnetic radiation on the electrical properties of the devices. Moreover, the encapsulation layer also fixes the relative position of multiple devices on the substrate to ensure the stability of the electrical connection. In this disclosure, after curing, the encapsulation layer further acts as a support plate, so that we can then conveniently form the conductive layer in the connection through hole on the substrate.

12. When the devices are at least two, the devices are chips or electronic devices, and at least two of the devices include at least one chip and at least one electronic device. Chips and electronic devices can be packaged at the same time to increase efficiency and reduce costs.

13. Before the conductive layer is formed, an auxiliary layer is formed on the inner wall of the connection through hole by means of the second opening, the auxiliary layer is electrically connected to the circuit layer, and then the conductive layer is formed on the auxiliary layer. The auxiliary layer is configured to assist in forming the conductive layer so that the conductive layer is better electrically connected to the device pins, the circuit pins, or better attached to the inner wall of the connection through hole.

14. The conductive layer is formed by electroplating, and the auxiliary layer is formed by a sputtering or vapor deposition process before the electroplating. The sputtered or vapor-deposited auxiliary layer is electrically connected to the circuit pins, and the electroplated conductive layer is attached to the auxiliary layer, which can be better plated on the one hand, and electrical connection between the conductive layer and the circuit pins can be better realized by the auxiliary layer on the other hand.

15. A (mold) release layer is provided on the bottom surface of the substrate, wherein the release layer has a mold groove with a contour matching with that of the circuit layer, after the connection through hole is formed, and the circuit layer is formed in the mold groove while the conductive layer is being formed. For example, the conductive layer and the circuit layer are made of the same conductive material, the conductive layer is formed by electroplating, a release layer is provided on the bottom surface of the substrate, and a model groove for circuit layer is formed in the release layer. After the connection through hole is formed, a conductive layer is formed in the connection through hole, and a conductive layer (i.e., a circuit layer, of the same material) is formed in the model groove and on a surface of the release layer at the same time, and then the mold release and the conductive layer on the surface thereof is removed to form the conductive layer on the surface of the substrate. By completing two operations in one process at the same time, the production efficiency is improved and the costs are reduced.

16. After the conductive layer is formed, a conductive connection port electrically connected to the conductive layer is formed on the bottom surface of the substrate, wherein the conductive connection port is a solder ball dot matrix, a connection dot matrix, or a metal pin grid. By providing the conductive connection port, on the one hand, the connection space of the device pins can be greatly expanded, which may facilitate the connection between the devices and external circuits. Generally, in order to reduce the volume, the devices are made as small as possible, and the space for the device pins on each device to be externally connected is very small. By providing the conductive connection port, the device pins of each device can be extended to the external conductive connection port on the bottom surface of the substrate, which greatly expands the connection space of the device. The direct benefit brought by such design is that in/out data communication channels can be arranged at a higher density, while increasing the communication bandwidth and transmission speed.

17. Each device is a chip or an electronic device. The integrated circuit packaging method is suitable for packaging of chips or electronic devices, wherein the electronic devices include but are not limited to separate resistors, capacitors, inductors, diodes, and transistors, the chips include but are not limited to dies, wafers, and packaged integrated chips. The chips or the electronic devices can be packaged using the same equipment and process flow to reduce costs.

18. The substrate is a flexible circuit board; or the substrate includes at least two layers of flexible circuit boards arranged in a stacked manner. With the integrated circuit packaging method, the device is mounted on the substrate, and the electrical connection between the devices and the circuit layer on the substrate is realized, and when the substrate is a flexible circuit board or a multiple layers of flexible circuit boards, the overall flexibility can be maintained, and the substrate is applicable to wearable devices, etc.

19. An integrated packaged circuit comprising: a device is provided with device pins; a substrate, a top surface of the substrate, a bottom surface of the substrate, or an interior of the substrate is provided with a circuit layer, wherein the circuit layer is provided with circuit pins, and the substrate is provided with connection through holes, and each connection through hole is connected to the respective circuit pin. In the above, the device is mounted on the substrate, the device pins face the substrate, a first opening of each connection through hole is connected to the respective device pin, and a second opening of the connection through hole is an operation window. A conductive layer is provided in the connection through hole, wherein the conductive layer electrically connects the respective device pin and the respective circuit pin. The conductive layer is formed by means of the connection through hole, and the manufacturing process is simple and the cost is low, thereby ensuring the performance of the integrated packaged circuit.

20. The device is mounted on the top surface of the substrate, the top surface of the substrate is provided with the circuit layer, an insulating medium is provided between the device and the substrate, wherein the insulating medium is provided with additional through holes. Each additional through hole is in communication with the first opening of the respective connection through hole, and the conductive layer extends into the additional through hole to be electrically connected to the respective device pin. An insulating medium is provided between the device and the substrate to prevent the device from affecting the circuit layer or other conductive structure on the top surface of the substrate. When the device has two or more device pins, some of the device pins are connected by the substrate or the circuit layer of the integrated circuit packaging method in the present disclosure, and the insulating medium can prevent other device pins from affecting the substrate or the circuit layer. Further, the insulating medium may be selected as a viscous material to is bond and fix the device to the substrate.

21. The substrate is a flexible circuit board, or the substrate includes at least two layers of flexible circuit boards arranged in a stacked manner. With the structural arrangement of the integrated packaged circuit, when the substrate is a flexible circuit board or multiple layers flexible circuit boards, the overall flexibility can be maintained, and the substrate is applicable to a wearable device or the like.

22. The top surface of the substrate is provided with a circuit layer, or/and the bottom surface of the substrate is provided with a circuit layer, or/and the interior of the substrate is provided with a circuit layer, wherein the device pins are at least two, one of the device pins is electrically connected to at least one of the circuit layers, and another one of the device pins is electrically connected to at least one of the remaining circuit layers. The substrate is provided with two or more circuit layers, and the device is electrically connected to at least two different circuit layers via different device pins to expand the circuit's functions.

DESCRIPTION OF THE REFERENCE SIGNS

100—substrate, 101—base plate, 110a, 110b—circuit layer, 120a, 120b—connection through hole, 120c—first opening, 120d—second opening, 121a, 121b—protective layer, 200—device, 210a, 210b, 210c—device pins, 300—insulating medium, 400a, 400b—conductive layer, 500—conductive connection port.

DETAILED DESCRIPTION OF EMBODIMENTS

The present disclosure will be further described in detail below, but embodiments of the disclosure are not limited thereto.

Embodiment 1

Figure 4:
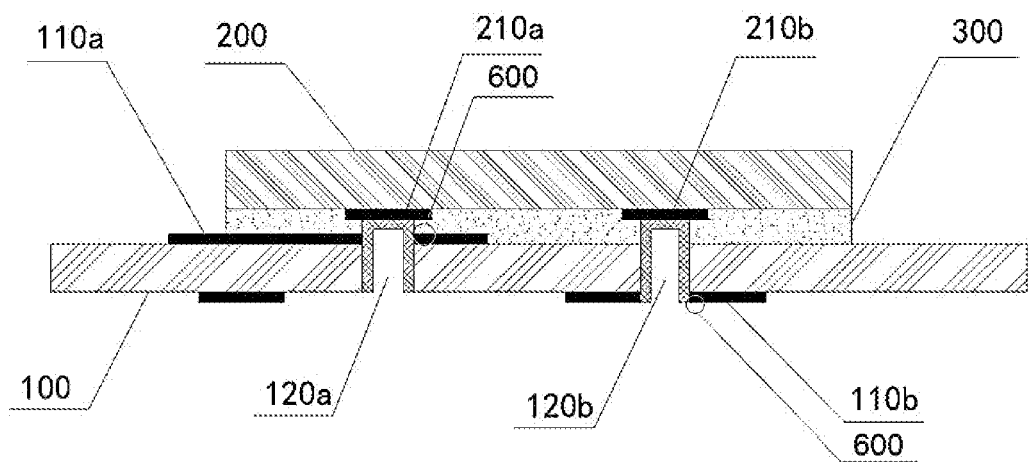
FIG. 4 is a fourth schematic diagram of an integrated circuit packaging method according to Embodiment 1 of the present disclosure.

In this embodiment, as shown in FIG. 4, the integrated packaged circuit includes: a device 200 and a substrate 100. The device 200 is mounted on a top surface of the substrate 100. The top surface and a bottom surface of the substrate 100 are respectively provided with circuit layers 110a and 110b. An insulating medium 300 (in the embodiment, the insulating medium 300 is simultaneously provided as an adhesive film) is provided between the device 200 and the substrate 100. The device 200 is provided with device pins 210a, 210b, wherein the device pins 210a, 210b face the substrate 100, the circuit layers 110a, 110b are each provided with circuit pins 600, and the substrate 100 is provided with connection through holes 120a, 120b, and the connection through holes 120a, 120b are connected to the circuit pins 600 respectively, a first opening 120c of each of the connection through holes 120a, 120b is connected to the respective device pins 210a, 210b, a second opening 120d of each of the connection through holes 120a, 120b is an operation window, and the insulating medium 300 (adhesive film) is provided with additional through holes respectively communicating with the first openings 120c of the connection through holes 120a, 120b. The connection through holes 120a, 120b are each provided therein with conductive layers 400a, 400b, wherein the conductive layers 400a, 400b extend into the additional through holes respectively to be electrically connected to the device pins 210a, 210b. In the above, the insulating medium 300 isolates the device 200 from the substrate 100. The insulating medium 300 (adhesive film) may prevent the device 200 from affecting the circuit layers 110a, 110b or other conductive structures on the top surface of the substrate 100. The number of device pins 210a, 210b of the device 200 may be set as needed. When the device pins 210a, 210b of the device 200 may be two or more, some of the device pins 210a, 210b are connected to the substrate 100 or the circuit layers 110a, 110b by means of the integrated circuit packaging method of the present disclosure, and the insulating medium 300 may prevent the rest of the device pins 210a, 210b from affecting the substrate 100 or the circuit layers 110a, 110b. In the present embodiment, the insulating medium 300 is also an adhesive film, and the insulating medium 300 (adhesive film) bonds the device 200 to the substrate 100. The device 200 is place on the substrate 100 by means of bonding, and the device 200 is fixed to the substrate 100 in the process of placing the device 200 on the substrate 100, thereby saving steps, improving efficiency, and reducing costs. However, optionally the insulating medium 300 may only function as the isolation between device 200 and the substrate 100, while other method may be used to fix the device 200 to the substrate 100, and the device 200 may be attached to the substrate 100 by using an adhesive film. However, the adhesive film does not serve an function of isolating the device 200 from the substrate 100.

Figure 1:
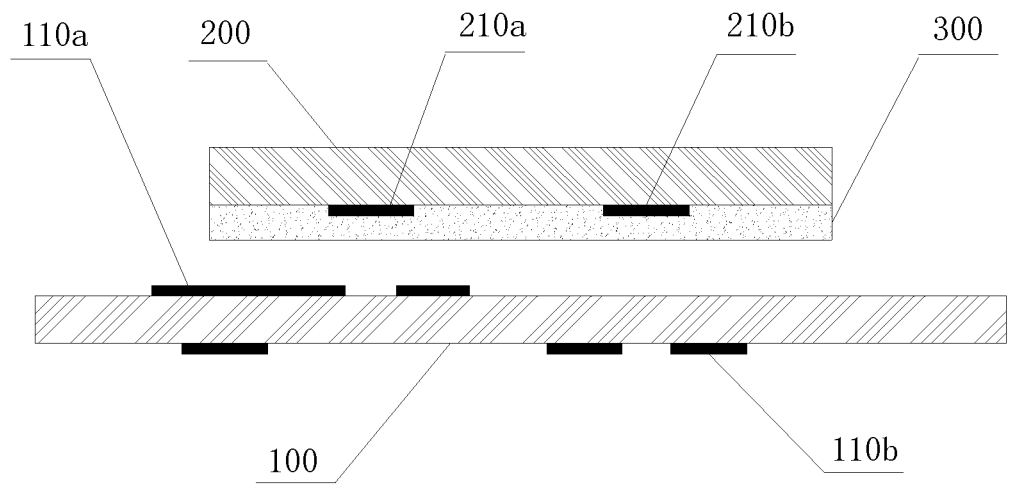
FIG. 1 is a first schematic diagram of an integrated circuit packaging method according to Embodiment 1 of the present disclosure.

In this embodiment, the integrated circuit packaging method includes: as shown in FIG. 1, providing circuit layers 110a, 110b on the top surface and the bottom surface of the substrate 100 respectively, wherein the circuit layers 110a, 110b are each provided with circuit pins, and the circuit pins may be connection portions directly led out from circuit layers 110a, 110b and may also be extension pins electrically connected to the connection portions, as long as electrical connection with the circuit layers 110a, 110b can be achieved by means of the circuit pins. The device pins 210a, 210b of the device 200 include, but are not limited to, connection portions drawn led out from inside the device 200 and extension pins electrically connected to the connection portions, as long as electrically connection to the device 200 can be achieved by means of the device pins 210a, 210b. The device pins 210a, 210b are connected to the first openings 120c of the connection through holes 120a, 120b.

Figure 2:
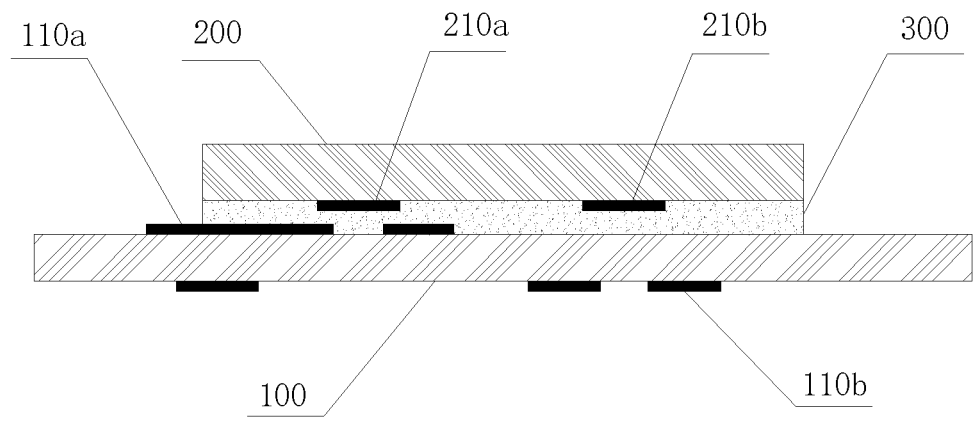
FIG. 2 is a second schematic diagram of an integrated circuit packaging method according to Embodiment 1 of the present disclosure.

As shown in FIG. 2, one surface of the device 200 on which the device pins 210a, 210b are provided is coated with an adhesive film (not limited to this embodiment, the adhesive film may be applied to the substrate 100), and one side of the device 200 provided with device pins 210a and 210b faces the substrate 100, and the device 200 is placed on the substrate 100. At this time, the adhesive film mounts the device 200 on the substrate 100. (In the embodiment, the adhesive film is at the same time the insulating medium 300, and is not limited to the embodiment, and the device 200 may be bonded without using the adhesive film.)

Figure 3:
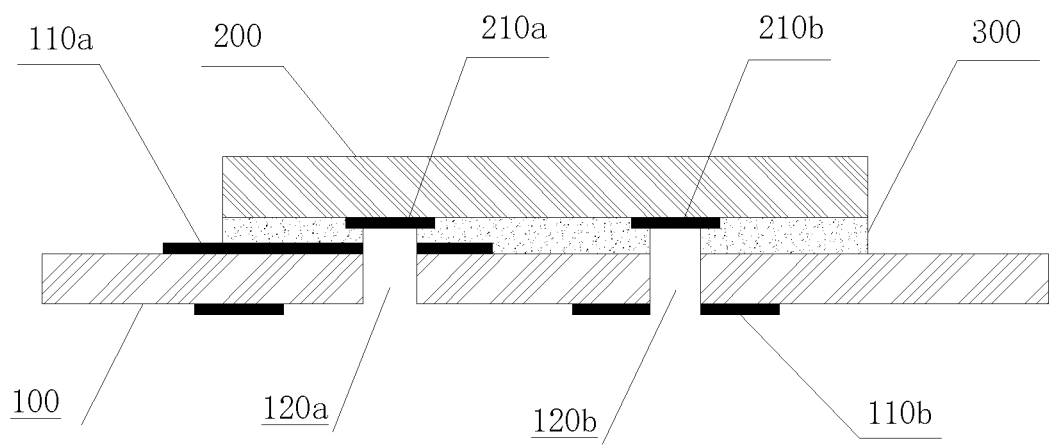
FIG. 3 is a third schematic diagram of an integrated circuit packaging method according to Embodiment 1 of the present disclosure.
Figure 8:
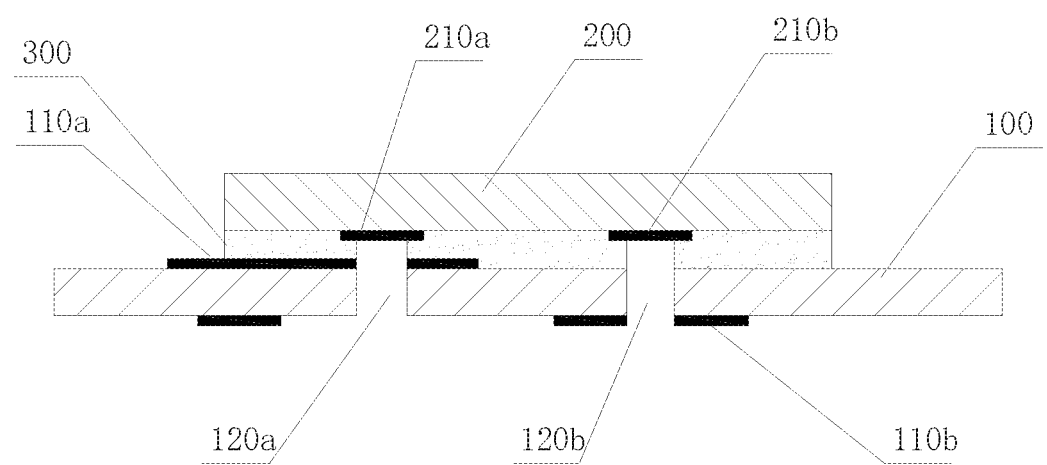
FIG. 8 is a third schematic diagram of an integrated circuit packaging method according to Embodiment 2 of the present disclosure.

As shown in FIG. 3, connection through holes 120a, 120b are formed on the substrate 100, and the device pins 210a, 210b are connected to the first openings 120c of the connection through holes 120a, 120b, and the second openings 120d of the through holes 120a, 120b may be used for forming the conductive layers 400a, 400b in the connection through holes 120a, 120b respectively. The structures of the first opening 120c and the second opening 120d are as shown in FIG. 8. The device pins 210a, 210b are located on the top surface of the substrate 100, the device 200 may be electrically connected to the circuit layers 110a, 110b from the bottom surface of the substrate 100 by means of the second openings 120d of the connection through holes 120a, 120b to avoid sheltering by the device pins 210a, 210b from above. Additional through holes are formed in the adhesive film by means of the second openings 120d of the connection through holes 120a, 120b, by using laser sintering, plasma cleaning, or a chemical solvent, wherein the additional through holes connect the through holes 120a, 120b with the device pins 210a, 210b respectively to avoid the adhesive film from hindering the electrical connections between the device pins 210a, 210b, the conductive layers 400a, 400b, and circuit pins.

As shown in FIG. 4, conductive layers 400a, 400b are formed in the connection through holes 120a, 120b by means of the second openings 120d connecting the through holes 120a, 120b, the conductive layers 400a, 400b extend into the additional through holes, and the conductive layers 400a, 400b electrically connect the device pins 210a, 210b to the circuit pins.

Packaging according to the above method can reduce the cost of the integrated circuit package and save packaging time. Moreover, the overall thickness of the substrate 100 and the device 200 is reduced, and even no gap is required to be reserved between the substrate 100 and the device 200 (in principle, no gap is required, but other materials may be provided between the substrate 100 and the device 200 as needed); no heat welding steps are needed, especially for packaging of ultra-thin devices 200 (such as ultra-thin chips) and flexible circuit board, which can avoid the overall thermo-mechanical stress distribution of the system caused by large temperature changes, and impact on the performance of device 200.

In addition, after the conductive layers 400a and 400b are formed, an encapsulation layer is provided on the substrate 100, and the device 200 is encapsulated by the encapsulation layer and the substrate 100; or, after the device 200 is placed on the substrate 100 and before the conductive layers 400a and 400b are formed, the encapsulation layer is provided on the substrate 100, and the two devices 200 are encapsulated by the encapsulation layer and the substrate 100. By encapsulating the device 200 using the encapsulation layer, the device 200 may be protected, and the encapsulation layer may cover the substrate 100. The encapsulation layer may be simultaneously provided on the top surface and the bottom surface of the substrate 100 to protect the substrate 100 and the circuit layer 110, 110b on the substrate 100, to avoid the influence from environmental factors. At the same time, the encapsulation layer also fixes the device 200 to the substrate 100 without the need for additional procedures for fixing the device 200. In addition, the cured encapsulation layer also becomes a better support plate for the entire system, and subsequent process may be performed on the flipped substrate.

In the above, the connection through holes 120a, 120b are connected to the device pins 210a, 210b, and the device pins 210a, 210b are at least partially located adjacent to the first openings 120c of the connection through holes 120a, 120b or extend deeply into the through holes 120a, 120b respectively, such that the conductive layers 400a, 400b may be electrically connected to the device pins 210a, 210b; the circuit pins are connected to the connection through holes 120a, 120b, and are at least partially located adjacent the first openings 120c or the second openings 120d of the connection through holes 120a, 120b, or the inner walls of the connection through holes 120a, 120b, so that the conductive layers 400a, 400b may be electrically connected to the circuit pins respectively; the device 200 may be a chip or an electronic devices (including but not limited to resistor, capacitor) or other electronic devices (including but not limited to antennas). The device 200 may be fixed to the substrate 100 by means of the connection through holes 120a, 120b and the conductive layers 400a, 400b, or the device 200 may be fixed to the substrate 100 by other means (including, but not limited to, bonding or molding a plastic package).

Figure 9:
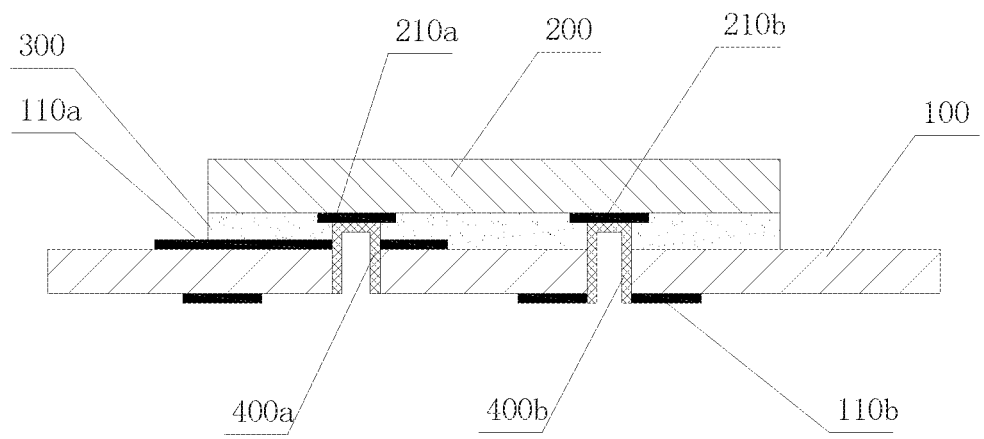
FIG. 9 is a fourth schematic diagram of an integrated circuit packaging method according to Embodiment 2 of the present disclosure.

In the above, during the process of forming the conductive layers 400a, 400b in the connection through holes 120a, 120b by means of the second openings 120d of the connection through holes 120a, 120b, the conductive layers 400a, 400b are formed by electroplating to finally form the conductive layer 400a, 400b. Referring to FIG. 4 and FIG. 9, a good electrical conductivity performance may be obtained, and electroplating can control the thickness of the conductive layers 400a, 400b to obtain desired electrical conductivity performance. However, optionally the present disclosure is not limited thereto, and the conductive bonding material may be fed into the connection through holes 120a, 120b by means of the second openings 120d of the connection through holes 120a, 120b during the process of forming the conductive layers 400a and 400b in the connection through holes 120a, 120b by means of the second openings 120d of the connection the through holes 120a, 120b. The conductive bonding material is bonded to the inner walls of the connection through holes 120a, 120b and the device pins 210a, 210b to form the conductive layers 400a, 400b. By feeding the conductive bonding material from the second openings 120d, operations may be performed on the back surface of the substrate 100 without being obstructed by the device 200, and the conductive bonding material is adhered to the inner walls of the connection through holes 120a, 120b and the device pins 210a, 210b of the device 200 by bonding, such that mechanical and electrical connections may be formed at the same time after proper heating or chemical treatment while stable conductive connection performance is also ensured. The conductive bonding material is solder ball, a solder paste, conductive paste, or conductive metal paste. The resultant formed conductive layers 400a, 400b can be referred to FIG. 13 and one or more combinations of conductive bonding materials may be selected according to the process requirements or the material of the substrate 100 or the property of the inner walls of the connection through holes 120a, 120b. Optionally, in the process of forming the conductive layers 400a, 400b in the connection through holes 120a, 120b by means of the second openings 120d of the connection through holes 120a, 120b, a conductive bonding material is provided in the connection through holes 120a, 120b by screen printing. Screen printing is a common manufacturing method for the circuit layers 110a, 110b. By using the screen printing to form the conductive layers 400a, 400b, the same equipment may be utilized and the screen printing may be synchronized with forming the circuit layers 110a, 110b, which saves the process flow and further reduces the cost.

Further, a plurality of devices 200 may be simultaneously mounted on a large substrate of a very large area, and the batch processing on the large substrate further reduces the cost and saves the packaging time. In mass production, a plurality of devices 200 are arranged on a carrier by using a carrier of a large flat plate, the carrier is covered on the top surface of the substrate 100, and the devices 200 are attached to the substrate 100 using an adhesive film to separate the carrier from the devices 200 (the device 200 may be mounted on the carrier by using a photosensitive or heat sensitive material, and the temperature or illumination may be changed to disengage the carrier and the device 200), after the packaging is completed, the substrate 100 is finally cut into a plurality of sub-boards according to a predetermined grouping. Each sub-board corresponds to a set of devices 200, each sub-board is separate. In this way, packaging operations can be performed in large quantities, and production efficiency is greatly improved (where the adhesive film can be an insulating material at the same time).

In this embodiment, the top surface and the bottom surface of the substrate 100 are respectively provided with circuit layers 110a, 110b, and the chip is electrically connected to the circuit layers 110a and 110b at the same time; however, optionally the circuit layers 110a, 110b may be embedded in the substrate 100, the device pins 210a, 210b are electrically connected to the circuit layers 110a, 110b respectively; or the top surface of the substrate 100 is provided with circuit layers 110a, 110b, and/or the bottom surface of the substrate 100 is provided with circuit layers 110a, 110b, and/or the interior of the circuit board 110 provided with circuit layers 110a, 110b, and the device pins 210a, 210b are at least two, one of the device pins 210a, 210b is electrically connected to at least one of the circuit layers 110a, 110b, and another one device pin 210a, 210b is electrically connected to at least one of the remaining circuit layers 110a, 110b. The substrate 100 is provided with two or more circuit layers 110a, 110b. The device 200 is electrically connected to at least two different circuit layers 110a, 110b by means of different device pins 210a, 210b to expand the circuit function.

In this embodiment, optionally, the substrate 100 may be a flexible circuit board; or the substrate 100 may include at least two layers of flexible circuit boards arranged in a stacked manner. The device 200 is mounted on the substrate 100 by the integrated circuit packaging method, and the electrical connection between the device 200 and the circuit layers 110a, 110b on the substrate 100 is realized. The overall thickness of the device 200 and the substrate 100 is small, and the overall flexibility can be maintained, which is applicable to wearable devices, etc.

In the above, the device 200 is a chip or an electronic device. The integrated circuit packaging method is suitable for packaging of chips or electronic devices, wherein electronic devices include but are not limited to separate resistors, capacitors, inductors, diodes, and transistors, and the chips include but are not limited to dies, wafers, or packaged integrated chips. The chips or electronic devices can be packaged using the same equipment and process flow to reduce costs.

FIGS. 1 to 4 illustrate only the structure of the single device 200, but is not limited thereto, and the device 200 may be at least two. The integrated circuit packaging method is applicable to two or more devices 200. Further, operations may be performed on two or more devices 200 simultaneously, and the above devices 200 are mounted on the substrate 100 to implement the electrical connection between the devices 200 and the circuit layers 110a, 110b to improve efficiency and reduce costs. When the device 200 is at least two, optionally, the at least two devices 200 include at least one chip and at least one electronic device. The chips and electronic devices may be packaged at the same time to increase efficiency and reduce costs. When an encapsulation layer is provided on the substrate 100, it is feasible to package a single device 200 or package two or more devices 200. The encapsulation layer mainly serves to protect the devices 200 from external environmental factors such as the influence of water vapor and electromagnetic radiation on the electrical performance of the device. At the same time, the encapsulation layer also fixes the relative positions of the plurality of devices 200 on the substrate 100 to ensure the stability of the electrical connection. In this disclosure, after the encapsulation layer is cured, the encapsulation layer is further used as a support plate, so that we may then conveniently form the conductive layer on the inner wall of each connection through hole on the substrate 100. In addition, two or more encapsulation layers may be provided on one substrate 100, and the encapsulation layers may have a gap between each other to provide a larger curvature, so that the whole of the substrate 100, the devices 200, and the encapsulation layers is more flexible, especially when the substrate 100 is formed by a flexible circuit board or substantially by two or more flexible circuit boards, the integrated packaged circuit can maintain such flexibility, so that the integrated packaged circuit can be applied to occasions where such flexibility needs to be maintained, such as a wearable device.

In the above, the circuit layers 110a, 110b are functional circuits, and the circuit layers 110a, 110b have certain electronic functions; or the circuit layers 110a, 110b themselves constitute electronic devices, including but not limited to antennas. The circuit layers 110a, 110b of the integrated packaged circuit structure have a wide range of applications, and can realize integration of various functions.

An auxiliary layer may be formed on the inner walls of each connection through holes 120a, 120b by means of the respective second opening 120d as needed before the conductive layers 400a, 400b are formed, wherein the auxiliary layer is electrically connected to the circuit layers 110a, 110b, and then the conductive layers 400a, 400b are formed on the auxiliary layer. The auxiliary layer is configured to assist in the forming of the conductive layers 400a, 400b, such that the conductive layers 400a, 400b are better electrically connected to the device pins 210a, 210b and the circuit pins, or better attached to the inner walls of the connection through holes 120a, 120b. Optionally, protective layers 121a, 121b are provided on the inner walls of the connection through holes 120a, 120b respectively, and the protective layers 121a, 121b are configured to protect the substrate 100 when the additional through holes are formed. The additional through holes may be formed by using, but not limited to, chemical etching or drilling process. In this case, it is necessary to pass through the connection through holes 120*a*, 120*b*, which may damage the material of the inner walls of the connection through holes 120*a*, 120*b*, and thus damaging the circuit layers 110*a*, 110*b* of the substrate 100, and the protective layers 121*a*, 121*b* may protect the inner walls of the connection through holes 120*a*, 120*b* from damage. Further, the protective layers 121*a*, 121*b* may be materials that facilitate the electrical connection of the conductive layers 400*a*, 400*b*. At this time, the protective layers 121*a*, 121*b* may be in contact with the circuit pins to facilitate the electrical connection between circuit pins and the conductive layers 400*a*, 400*b*.

In this embodiment, the inner walls of the connection through holes 120*a*, 120*b* are provided with protective layers 121*a*, 121*b* respectively, the protective layers 121*a*, 121*b* are also auxiliary layers, and the protective layers (auxiliary layers) 121*a*, 121*b* are not shown in the drawing, referring to FIG. 10 to FIG. 13. Further, in the present embodiment, the protective layers (auxiliary layers) 121*a*, 121*b* are made of the same material as the circuit layers 110*a*, 110*b*. For example, the circuit layers 110*a*, 110*b* are made of copper and the protective layers (auxiliary layers) 121*a*, 121*b* are also made of copper, further improving the electrical connection performance. However, the present disclosure is not limited to this embodiment, and other materials may be used as needed, and the protective layers 121*a*, 121*b* providing the protection or the auxiliary layers assisting in electrical connection may be separately provided. In the above, the protective layers (auxiliary layers) 121*a*, 121*b* are electrically connected to the circuit layers 110*a*, 110*b*, and the conductive layers 400*a*, 400*b* electrically connect the device pins 210*a*, 210*b* to the circuit pins. The protective layers (auxiliary layers) 121*a*, 121*b* are directly electrically connected to the circuit pins, and the effect of electrical connection is good, moreover, the circuit pins may be extended to reduce the volume of the conductive layers 400*a*, 400*b*, which is advantageous for forming the conductive layers 400*a*, 400*b*, and is also advantageous for reducing the costs.

In this embodiment, the conductive layers 400*a* and 400*b* may be formed by electroplating, and the auxiliary layers may be formed by a sputtering or vapor deposition process before electroplating. The sputtered or vapor-deposited auxiliary layers may be better electrically connected to the circuit pins, and the electroplated conductive layers 400*a*, 400*b* are attached to the auxiliary layers, which can make the electroplating to be better performed on the one hand, and the electrical connection between the conductive layers 400*a*, 400*b* and the circuit pins can be better realized by the auxiliary layer on the other hand. Moreover, sputtering, vapor deposition, and electroplating may simultaneously perform on all of the devices 200 on the substrate 100 to improve efficiency.

In the present embodiment, the circuit layers 110*a* and 110*b* are formed on the substrate 100 in advance, but are not limited thereto, optionally, the circuit layers 110*a*, 110*b* may be formed on the substrate 100 during the packaging of the integrated circuit. For example, a release layer may be provided on the bottom surface of the substrate 100, wherein the release layer has a mold groove having a contour similar to those of the circuit layers 110*a*, 110*b*. After the connection through holes 120*a* and 120*b* are formed, the circuit layers 110*a* and 110*b* are formed in the mold groove while the conductive layers 400*a* and 400*b* are formed.

Taking the electroplating manufacturing method as an example, the conductive layers 400*a*, 400*b* and the circuit layers 110*a*, 110*b* are made of the same material, and while electroplating the conductive layers 400*a*, 400*b*, a conductive layer is also electroplated in the mold groove and on the surface of the release layer, then the release layer and the conductive layer on the surface thereof are removed to form the circuit layers 110*a*, 110*b* on the surface of the substrate. The process of forming the conductive layers 400*a*, 400*b* by electroplating further includes forming auxiliary layers on surface of the device pins 210*b* and 210*c* and in the connection through holes 120*a* and 120*b* by sputtering or vapor deposition before the electroplating, and then the electroplating is performed. The sputtered or vapor-deposited auxiliary layers can be better electrically connected to the circuit pins, and the electroplated conductive layers 400*a*, 400*b* are attached to the auxiliary layers. Sputtering or vapor deposition of the auxiliary layers on the one hand can improve the quality of the electroplating, and on the other hand, can better realize the electrical connection between the conductive layers 400*a*, 400*b* and the circuit pins.

Embodiment 2

Figure 5:
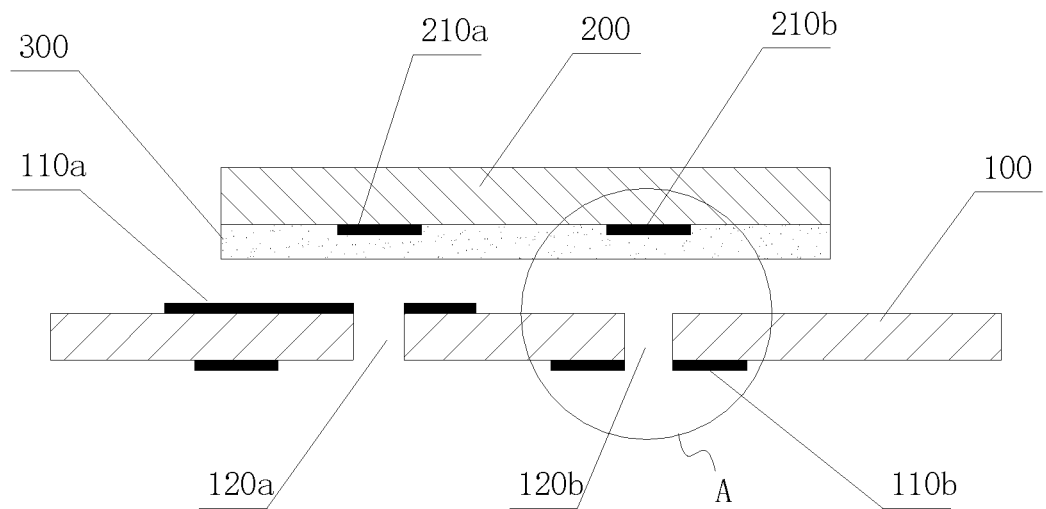
FIG. 5 is a first schematic diagram of an integrated circuit packaging method according to Embodiment 2 of the present disclosure.
Figure 6:
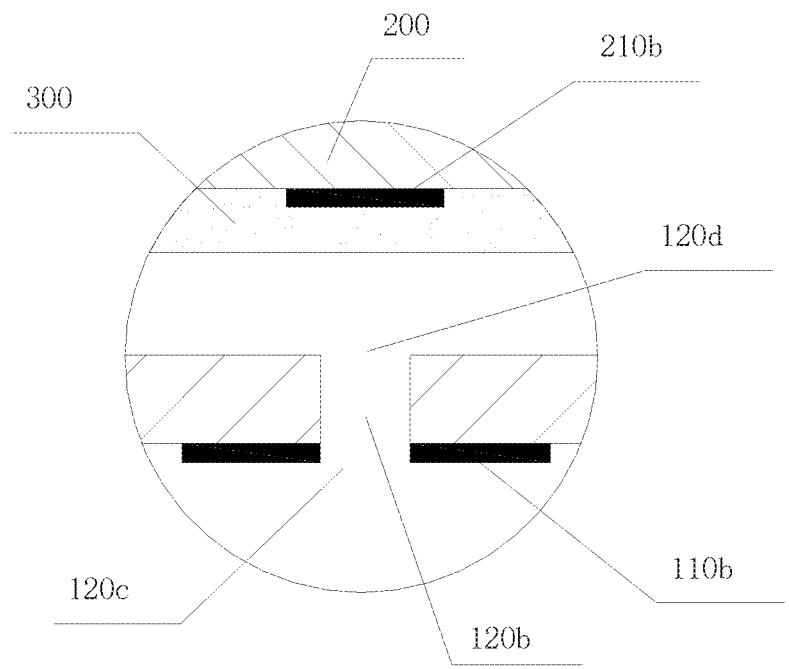
FIG. 6 is an enlarged view of A in FIG. 5.
Figure 7:
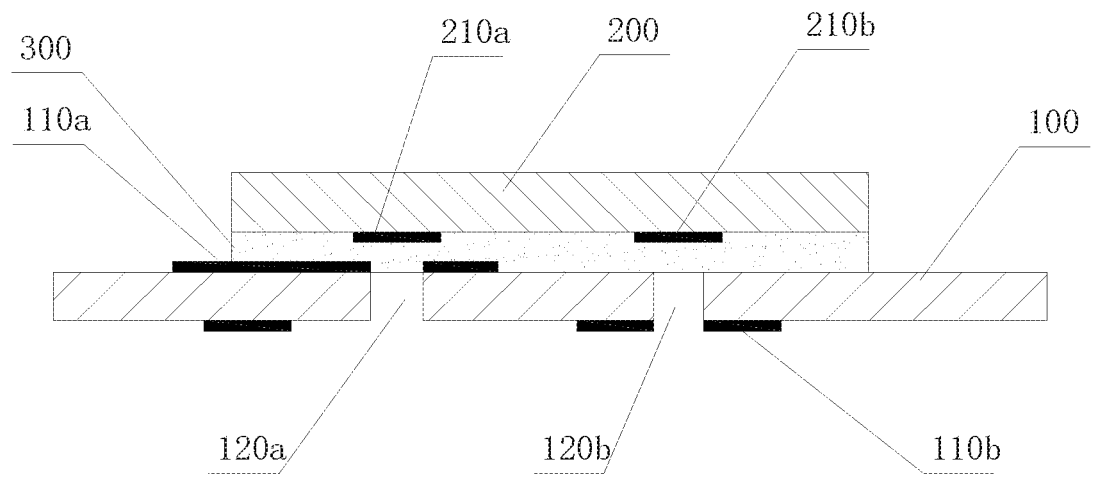
FIG. 7 is a second schematic diagram of an integrated circuit packaging method according to Embodiment 2 of the present disclosure.

The difference between Embodiment 2 and Embodiment 1 is:

The connection through holes 120*a* and 120*b* are formed on the substrate 100 in advance, and then the device 200 is mounted on the substrate 100. As shown in FIG. 5 to FIG. 9, the specific steps are: providing prepared connection through holes 120*a*, 120*b* on the substrate 100, as shown in FIG. 5, placing the device 200 on the substrate 100, connecting the device pins 210*a*, 210*b* of the device 200 to the first openings 120*c* of the connection through holes 120*a*, 120*b* respectively. As shown in FIG. 6, in this embodiment, an insulating medium 300 (in this embodiment, the insulating medium 300 is also an adhesive film which has the function of isolating the device 200 from the substrate 100 and bonding the device 200 to the substrate 100, however, the present disclosure is not limited thereto) is provided between the device 200 and the substrate 100. Additional through holes are formed on the insulating medium 300, and the additional through holes are connected to the device pins 210*a*, 210*b* as well as the first openings 120*c* of the connection through holes 120*a* and 120*b*, as shown in FIG. 7, the conductive layers 400*a*, 400*b* are formed in the connection through holes 120*a*, 120*b*, wherein the conductive layers 400*a* and 400*b* deeply extend into the additional through holes to electrically connect device pins 210*a*, 210*b* to the circuit pins, as shown in FIG. 9. The foregoing device pins 210*a*, 210*b* are connected to the first openings 120*c* of the connection through holes 120*a*, 120*b*, and are not necessarily strictly aligned as long as the device pins 210*a*, 210*b* can be electrically connected to the conductive layers 400*a*, 400*b* by means of the additional through holes and the connection through holes 120*a*, 120*b*.

Figure 10:
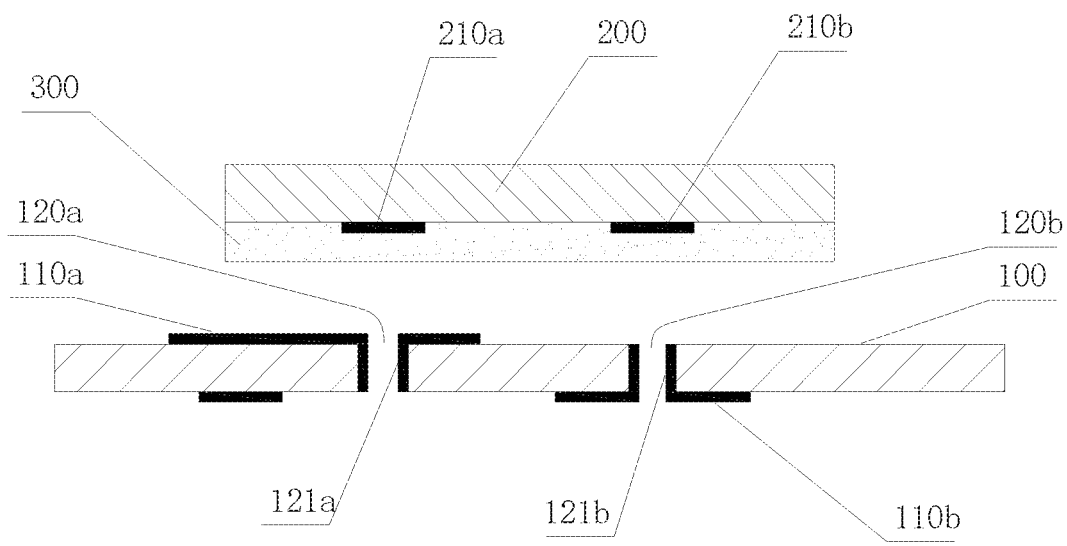
FIG. 10 is a fifth schematic diagram 5 of a method for packaging an integrated circuit according to Embodiment 2 of the present disclosure.
Figure 11:
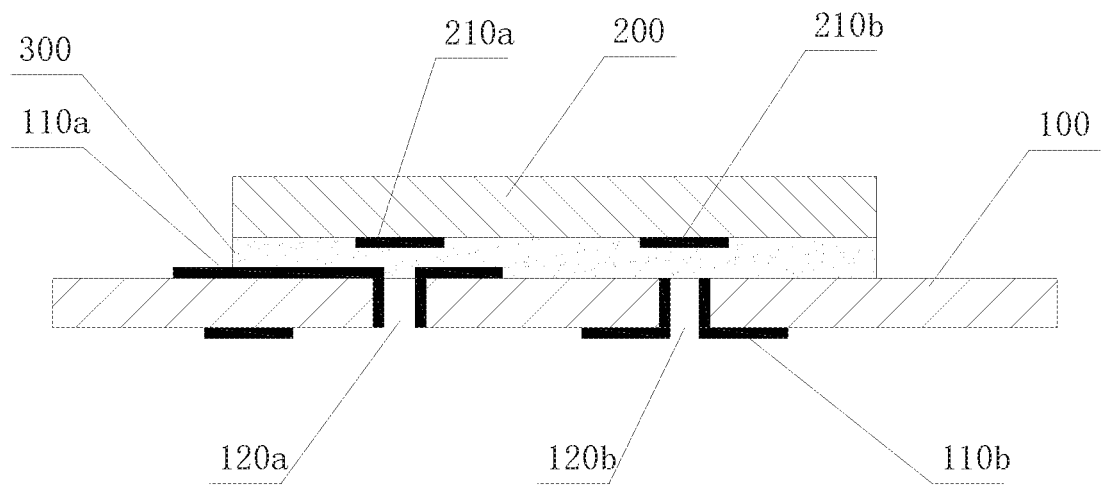
FIG. 11 is a sixth schematic diagram of an integrated circuit packaging method according to Embodiment 2 of the present disclosure.
Figure 12:
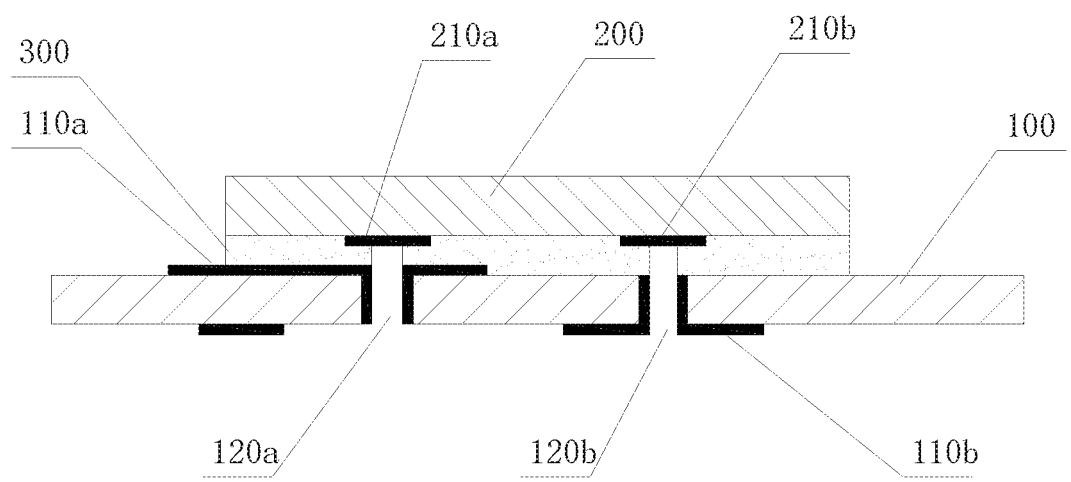
FIG. 12 is a seventh schematic diagram of an integrated circuit packaging method according to Embodiment 2 of the present disclosure.
Figure 13:
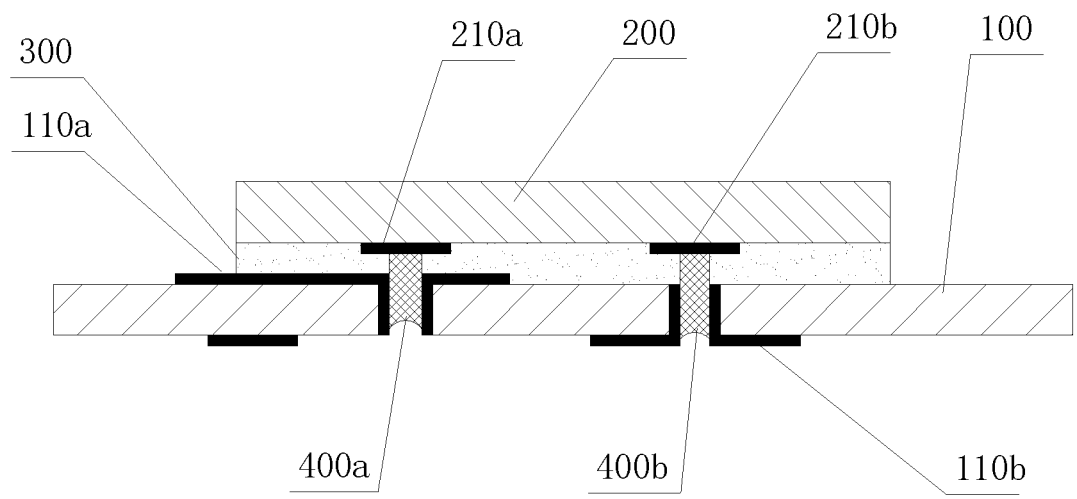
FIG. 13 is an eighth schematic diagram of an integrated circuit packaging method according to Embodiment 3 of the present disclosure.

As shown in FIG. 10, in this embodiment, the protective layers (auxiliary layers) 121*a*, 121*b* are electrically connected to the circuit layers 110*a*, 110*b*, as shown in FIG. 11, the device 200 is placed on the substrate 100, and the adhesive film (insulating medium 300) is bonded to the substrate 100; as shown in FIG. 12, auxiliary through holes are formed in the adhesive film (insulating material); as shown in FIG. 13, conductive layers 400*a*, 400*b* are formed in the connection through holes 120*a*, 120*b* respectively, wherein the conductive layers 400*a*, 400*b* electrically connect device pins 210*a*, 210*b* to circuit pins respectively. The auxiliary layers (protective layers 121*a*, 121*b*) are directly connected to the circuit pins, the effect of electrical connection is good, and the circuit pins may be extended to reduce the volume of the conductive layers 400*a*, 400*b*, which is advantageous for the forming of the conductive layers 400a, 400b, and is also advantageous for reducing costs.

Embodiment 3

The difference between Embodiment 3 and Embodiment 1 is:

The substrate 100 includes at least two base plates 101, the at least two base plates are arranged in a stacked manner, and a top surface of a base plate 101 and/or a bottom surface of a base plate 101 is/are provided with the circuit layers 110a, 110b, at least one of the substrates 101 has a via hole, and at least two of the circuit layers 110a, 110b are electrically connected by means of the via hole. By extending a range of connection of the device 200, more circuit connections can be realized in a smaller circuit volume.

Figure 14:
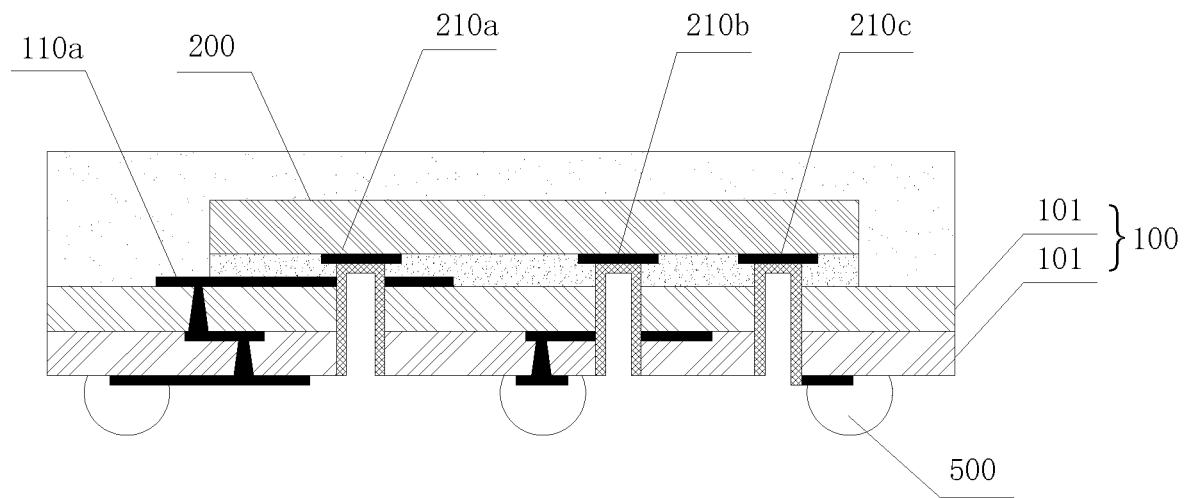
FIG. 14 is a schematic structural diagram of an integrated packaged circuit according to Embodiment 3 of the present disclosure.

After the conductive layers 400a, 400b are formed, a conductive connection port 500 electrically connected to the conductive layers 400a, 400b is formed on the bottom surface of the substrate 100. As shown in FIG. 14, the conductive connection port 500 is a solder ball dot matrix, connection dot matrix, or a metal pin grid. The device pin 210c of the device 200 is connected to the conductive connection port 500 on the bottom surface of the substrate 100, which can greatly expand a connection space of the device pin 201c, and facilitate the connection between the device 200 and external circuits. Generally, in order to reduce the volume, the device 200 is made as small as possible, and the space available for the external connection of the device pin 210c is very small, by means of the conductive connection through holes 400, 400a, 400b and the circuit layers 110a, 110b on the bottom or top surface of the substrate or inside the substrate, the device pin 210c may extend to the external conductive connection port 500 on the bottom surface of the substrate, which greatly expands the connection space of the device. The direct benefit of such design is that in/out data communication channels can be set at a higher density, while increasing the communication bandwidth and transmission speed.

The technical features of the above embodiments may be combined at will. For the sake of brevity of description, all possible combinations of the technical features in the above embodiments are not described. However, as long as there is no contradiction in the combination of these technical features, they shall be considered as fallen within the range described in this specification.

The above embodiments are merely illustrative of several embodiments of the present disclosure, and the description thereof is more specific and detailed, but they are not to be construed as limiting the scope of the present disclosure. It should be noted that a number of variations and modifications may be made by those skilled in the art without departing from the conception of the present disclosure. Therefore, the protection scope of the present disclosure should be determined by the appended claims.

What is claimed is:

1. An integrated circuit packaging method, comprising:
providing a top surface of a substrate with a circuit layer having circuit pins, or providing the top surface and an interior of the substrate with the circuit layer, or providing the top surface, the interior, and a bottom surface of the substrate with the circuit layer, placing devices on the substrate with the devices provided with the device pins on a side facing the substrate;
forming connection through holes on the substrate such that the connection through holes are connected with the circuit pins respectively, with a first opening of each connection through hole connected with the respective device pin, and forming a conductive layer by means of a second opening of the connection through hole, wherein the conductive layer electrically connects the device pin to the respective circuit pin;
wherein the method further comprises:
providing an adhesive film between the device and the substrate in process of placing the devices on the substrate, so that the adhesive film bonds the devices to the substrate, wherein no through hole is provided in the adhesive film before the adhesive film bonds the devices to the substrate; and
forming additional through holes in the adhesive film by means of the second opening of the connection through hole after the adhesive film bonds the devices to the substrate, wherein each additional through hole connects the respective connection through hole to the respective device pin and the respective conductive layer extends into the additional through hole.

2. The integrated circuit packaging method according to claim 1, wherein in process of forming a conductive layer in the connection through hole by means of the second opening of the connection through hole, a conductive bonding material is fed into the connection through hole from the second opening of the connection through hole, and the conductive bonding material is bonded to an inner wall of the connection through hole and the respective device pin to form the conductive layer.

3. The integrated circuit packaging method according to claim 2, wherein the conductive bonding material is solder ball, solder paste, conductive paste, or conductive metal paste.

4. The integrated circuit packaging method according to claim 2, wherein in the process of forming a conductive layer in the connection through hole by means of the second opening of the connection through hole, the conductive bonding material is provided in the connection through hole by screen printing.

5. The integrated circuit packaging method according to claim 1, wherein in the process of forming a conductive layer in the connection through hole by means of the second opening of the connection through hole, the conductive layer is formed by electroplating.

6. The integrated circuit packaging method according to claim 1, wherein the additional through holes are formed in the adhesive film using laser melting, plasma cleaning, or chemical solvent.

7. The integrated circuit packaging method according to claim 6, wherein a protective layer is provided on an inner wall of the connection through hole, and the protective layer is configured to protect the substrate when the additional through holes are formed.

8. The integrated circuit packaging method according to claim 1, further comprising:
providing, after the conductive layer is formed, an encapsulation layer on the substrate, wherein two of the devices are encapsulated by the encapsulation layer and the substrate; or
providing, after the devices are mounted on the substrate and before the conductive layer is formed, the encapsulation layer on the substrate, wherein two of the devices are encapsulated by the encapsulation layer and the substrate.

9. The integrated circuit packaging method according to claim 1, wherein the devices are in number of at least two.

10. The integrated circuit packaging method according to claim 9, further comprising: providing an encapsulation layer on the substrate, wherein at least two of the devices are encapsulated by the encapsulation layer and the substrate.

11. The integrated circuit packaging method according to claim 9, wherein each device is a chip or an electronic device, and the at least two of the devices include at least one chip and at least one electronic device.

12. The integrated circuit packaging method according to claim 1, wherein an auxiliary layer is formed on an inner wall of each connection through hole by means of the second opening before the conductive layer is formed, wherein the auxiliary layer is electrically connected with the circuit layer, and then the conductive layer is formed on the auxiliary layer.

13. The integrated circuit packaging method according to claim 12, wherein the conductive layer is formed by electroplating, and the auxiliary layer is formed by sputtering or vapor deposition process prior to electroplating.

14. The integrated circuit packaging method according to claim 1, wherein a conductive connection port electrically connected to the conductive layer is formed on the bottom surface of the substrate after the conductive layer is formed, and the conductive connection port is solder ball dot matrix, or connection dot matrix, or metal pin grid.

15. The integrated circuit packaging method according to claim 1, wherein each device is a chip or an electronic device.

\* \* \* \* \*